(12) United States Patent
Lee et al.

(10) Patent No.: US 7,588,869 B2
(45) Date of Patent: Sep. 15, 2009

(54) DIVIDED EXPOSURE METHOD FOR MAKING A LIQUID CRYSTAL DISPLAY

(75) Inventors: Su Woong Lee, Gumi-si (KR); Sang Yoon Paik, Seoul (KR)

(73) Assignee: LG Display Co., Ltd., Seoul (KR)

( * ) Notice: Subject to any disclaimer, the term of this patent is extended or adjusted under 35 U.S.C. 154(b) by 930 days.

(21) Appl. No.: 11/023,550

(22) Filed: Dec. 29, 2004

(65) Prior Publication Data

US 2005/0142458 A1    Jun. 30, 2005

(30) Foreign Application Priority Data

Dec. 30, 2003  (KR) .................. 10-2003-0099807
Dec. 30, 2003  (KR) .................. 10-2003-0099808

(51) Int. Cl.
*G03F 9/00* (2006.01)
*G03F 7/22* (2006.01)

(52) U.S. Cl. ................. 430/22; 430/30; 430/394

(58) Field of Classification Search ............. 430/22, 430/30

See application file for complete search history.

(56) References Cited

U.S. PATENT DOCUMENTS

| | | | | |
|---|---|---|---|---|
| 4,408,875 A | * | 10/1983 | Majima | 355/77 |
| 7,211,372 B2 | * | 5/2007 | Park et al. | 430/394 |
| 2001/0018153 A1 | * | 8/2001 | Irie | 430/5 |
| 2005/0024622 A1 | * | 2/2005 | Kim | 355/53 |
| 2006/0088790 A1 | * | 4/2006 | Moon et al. | 430/394 |

* cited by examiner

*Primary Examiner*—Mark F Huff
*Assistant Examiner*—John Ruggles
(74) *Attorney, Agent, or Firm*—McKenna Long & Aldridge

(57) ABSTRACT

A divided exposure method for a photolithography process is disclosed, which uses a mask. The mask for an exposer having a left and right light intensity deviation includes a substrate; a first pattern in a middle of the substrate; and second and third patterns on left and right sides of the first pattern, respectively, wherein the first and second patterns compensate for the left and right light intensity deviation of the exposer.

4 Claims, 5 Drawing Sheets

DIVIDED EXPOSURE METHOD FOR MAKING A LIQUID CRYSTAL DISPLAY

This application claims the benefit of Korean Patent Application Nos. P2003-99807 and P2003-99808 filed in Korea on Dec. 30, 2003 and Dec. 30, 2003, respectively, which are hereby incorporated by reference for all purposes as if fully set forth herein.

BACKGROUND OF THE INVENTION

1. Field of the Invention

The invention relates to a liquid crystal display panel, and more particularly to an exposure mask that compensates light intensity deviation of an exposer.

2. Discussion of the Related Art

Generally, liquid crystal display devices display pictures by controlling the light transmissivity of liquid crystal having a dielectric anisotropy using an electric field. The liquid crystal display devices include a liquid crystal display panel that has a plurality of liquid crystal cells arranged in a matrix configuration for displaying pictures, and a drive circuit for driving the liquid crystal display panel. Active matrix type liquid crystal displays, which independently drive liquid crystal cells using a thin film transistor, are widely used for televisions as well as display devices for personal computers.

The liquid crystal display panel includes a thin film transistor substrate and a color filter array substrate, which are opposite to each other; liquid crystal provided between the two substrates; and a spacer to maintain a cell gap between the substrates.

The thin film transistor substrate includes gate and data lines; a thin film transistor formed near the crossing of the gate and the data lines; a pixel electrode at each of the liquid crystal cells connected to the thin film transistor; and an alignment film formed thereover.

The color filter substrate includes color filters corresponding to the liquid crystal cells; a black matrix between the color filters to reflect external light; a common electrode to commonly supply a reference voltage to the liquid crystal cells; and an alignment film formed thereover.

The thin film transistor substrate and the color filter substrate are made separately, bonded together, and then liquid crystal is provided between the two substrates and sealed, to form the liquid crystal display panel.

A plurality of mask processes are required to form the patterns of the thin film transistor substrate and the color filter substrate. Each mask process includes a thin film deposition process, a cleansing process, a photolithography process, an etching process, a photo-resist exfoliation process and an inspection process. When the substrate is larger than the effective area of the exposer used in the photolithography process, a stitch (divided) exposure method is employed. The stitch exposure method includes exposing the substrate in sections.

FIG. 1 illustrates a stitch exposure method according to a related art. Referring to FIG. 1, a substrate 20 has a thin film (a metal layer, an insulating film, a semiconductor layer or the like, not shown) for patterning, and a photo-resist formed on the thin film. By exposing the photo-resist to light through a mask 10, a photo-resist pattern is formed corresponding to a pattern of the mask 10 during the exposure process. Because the substrate 20 is larger than the mask 10, the exposure process is repeated to form the photo-resist pattern shown in FIG. 1, while moving the mask 10. The unit of one exposure process using the mask is called a shot, and the exposed area of the substrate corresponding to one shot is the shot area. For example, the photo-resist pattern on the substrate 20, shown in FIG. 1, has four shot areas A to D. In other words, while moving the mask 10, the photo-resist pattern of each shot area, A to D, is sequentially exposed.

Each shot area is exposed to light by an exposer that scans in a vertical direction of the substrate 20. Generally, the exposer is such that the light intensity (luminous intensity) is relatively high at the middle part of the shot area and is low at the left and/or right side of the shot area. An exemplary relationship between light intensity of an exposer and location of a shot area is illustrated in FIG. 1. Furthermore, the light intensity decreases in a different ratio between the left and right sides of the shot area, which is also illustrated in FIG. 1. The difference in light intensity between the left and right sides of the shot area causes the pattern formed on the left side and the pattern formed on the right side to have different critical dimensions CD, i.e., a deviation in the pattern's thickness and location. Because there is a CD deviation between the patterns formed at the boundary between adjacent shot areas, a stitch stain is introduced in the liquid crystal display panel.

For example, the pattern formed in the middle part of the shot area has a CD of P, and due to the difference in light exposure, the pattern formed at the left side of each of the shot areas A to D has a CD of P+2a, and the pattern formed at the right side has a CD of P+a. Generally, the light intensity at the right side, which is greater than the light intensity at the left side, causes the pattern formed on the right side of the shot area to have a greater CD than the pattern formed on the left side of the shot area. Accordingly, a boundary area between adjacent shot areas A to D is formed by a left pattern having a CD of P+2a and a right pattern having a CD of P+a, resulting in a CD deviation between the shot areas. In other words, the left and right patterns, which have a CD deviation ratio of 2a:a, are adjacent to each other in the boundary area of the shot areas A to D. The stitch stain is generated in the liquid crystal display panel due to the CD deviation in the boundary area between the shot areas A to D.

In order to solve this problem, a method has been proposed wherein patterns are formed to be divided at both sides of the mask and the patterns are overlapped to be composed in the adjacent shot areas, thereby reducing the CD deviation. However, because of the difference in light intensity between the left and right sides of the exposer, the CD deviation between the patterns formed at the left and right sides of the mask remains, and the stitch stain problem still exists.

SUMMARY OF THE INVENTION

Accordingly, the invention is directed to an exposure mask and an exposure method using the same that substantially obviate one or more of the problems due to limitations and disadvantages of the related art.

An advantage of the invention is to provide an exposure mask that compensates for the deviation in the luminous intensity of an exposer, thereby preventing a stitch stain in the liquid crystal display panel.

Additional features and advantages of the invention will be set forth in the description which follows, and in part will be apparent from the description, or may be learned by practice of the invention. The objective and other advantages of the invention will be realized and attained by the structure particularly pointed out in the written description and claims thereof as well as the appended drawings.

To achieve these and other advantages in accordance with the purpose of the present invention, as embodied and broadly described, a mask for an exposer having a left and right light intensity deviation includes a substrate; a first pattern in a middle of the substrate; and second and third patterns on left and right sides of the first pattern, respectively, wherein the second and third patterns compensate for the left and right light intensity deviations of the exposer.

In another aspect of the present invention, a divided exposure method using a mask having an non-overlapping part and left and right overlapping parts, wherein the amount of the patterns at the left and right overlapping parts is different from the amount pattern of the non-overlapping part, the method includes providing a substrate having a thin film; forming a photoresist layer on the thin film; providing the mask over a first shot area of the photoresist layer; irradiating light onto the first shot area through the mask; positioning the mask to a second shot area of the photoresist layer, wherein the second shot area partially overlaps the first shot area such that the right overlapping part of the mask corresponds to a portion of the first shot area that also corresponds to the left overlapping part of the mask for the second shot area; and irradiating light onto the second shot area through the mask, and wherein the amount of the patterns at the left and right overlapping parts is different from each other in order to compensate for the left and right exposure light intensity deviation.

In yet another aspect of the present invention, a divided exposure method using a mask includes providing a substrate having a thin film; forming a photoresist layer on the thin film, wherein the photoresist layer is divided into at least first and second shot areas; irradiating a first light on the first shot area through the mask by an exposer; positioning the mask to the second shot area; and irradiating a second light on the second shot area through the mask by the exposer, wherein the intensity of the second light exposed to a left side of the second shot area is substantially the same as the intensity of the first light exposed to a right side of the first shot area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the invention, examples of which are illustrated in the accompanying drawings.

Figure 2:
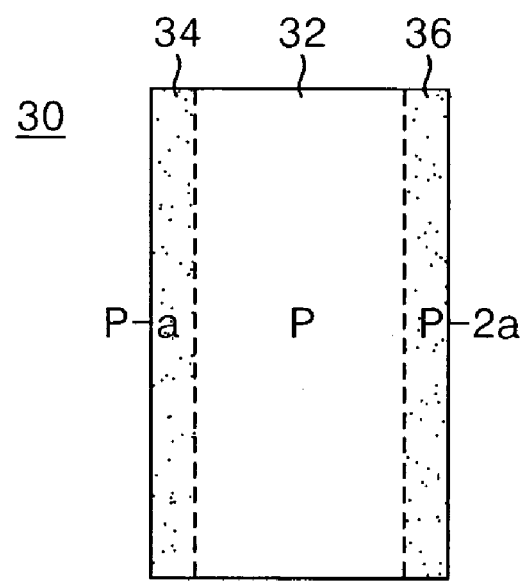
FIG. 2 illustrates an exposure mask according to a first embodiment of the present invention.
Figure 2:
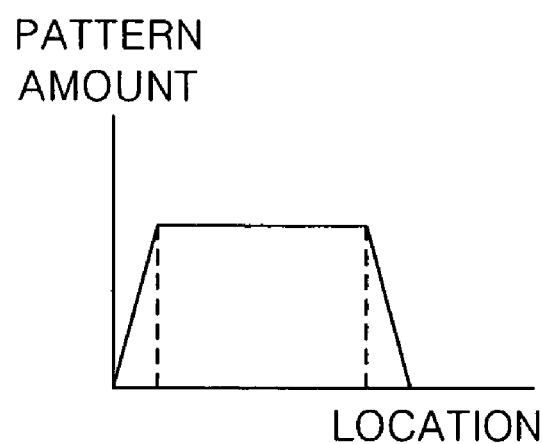

Hereinafter, embodiments of the invention will be described in detail with reference to FIGS. 2 to 5. FIG. 2 illustrates a mask 30 according to a first embodiment of the present invention. The mask 30 is divided into three parts, a non-overlapping part 32 where a pattern is formed to have a predetermined CD, and left and right overlapping parts 34, 36 where the amount of a pattern decreases in the direction of the horizontal edges of the mask 30, as illustrated in FIG. 2. The amount of the pattern at the left and right overlapping parts 34 and 36 can be controlled by adjusting, for example, the area, size, thickness or transmittance of the pattern, and relates. to CD. The left and right overlapping parts 34 and 36 of the mask 30 correspond to the areas where adjacent shot areas overlap each other. Furthermore, in order to compensate for the CD deviation caused by the difference in light intensity of the left and right sides of an exposer, the amount of pattern of the left overlapping part 34 decreases in a different ratio in comparison with the amount of pattern of the right overlapping part 36.

Generally, the light intensity (luminous intensity) of the right side of the exposer is greater than the light intensity of the left side of the exposer. Thus, in order to compensate for this, the pattern at the left overlapping part 34 of the mask 30 is formed to have a larger CD than the pattern at the right overlapping part 36 according to the present invention. In other words, the patterns formed at the left and right overlapping parts 34 and 36 of the mask 30 compensate for the difference in light intensity of the left and right sides of the exposer, which means, the mask 30 is formed to have a CD deviation opposite the light intensity difference of the exposure.

For example, when the pattern formed at the non-overlapping part 32 of the mask 30 has a CD of P and the patterns formed at the left and right overlapping parts 34 and 36 have CDs of P−a and P−2a, respectively, (where the amount of the patterns decreases in the direction of the horizontal edges of the mask 30 from the non-overlapping part 32), then the relationship between the light exposure deviation of the exposer and the CD deviation of the mask 30 may be defined as follows. The light exposure deviation of the left and right sides of the exposer is (P+2a):(P+a)=2a:a. The CD deviation of the left and right overlapping parts 34 and 36 of the mask 30 can be (P−a):(P−2a) or (P):(P+2a) or (P+2a):(P+a) to compensate the light exposure deviation of the exposer. Due to such a CD deviation in the mask 30, the gradients of the amount of the patterns at the left and right overlapping parts 34 and 36 are asymmetric with respect to the non-overlapping part 32.

Figure 3:
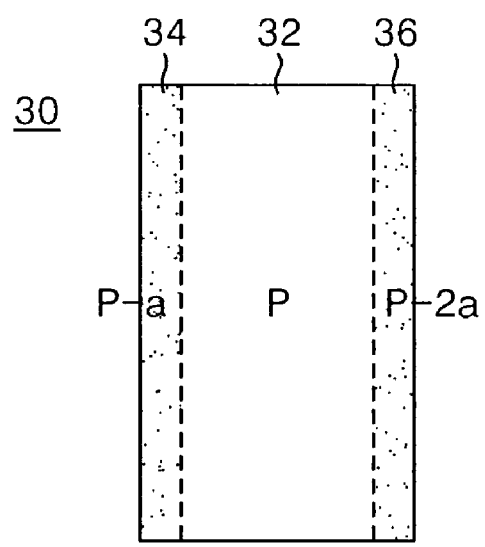
FIG. 3 illustrates a stitch exposure method using the exposure mask illustrated in FIG. 2.
Figure 3:
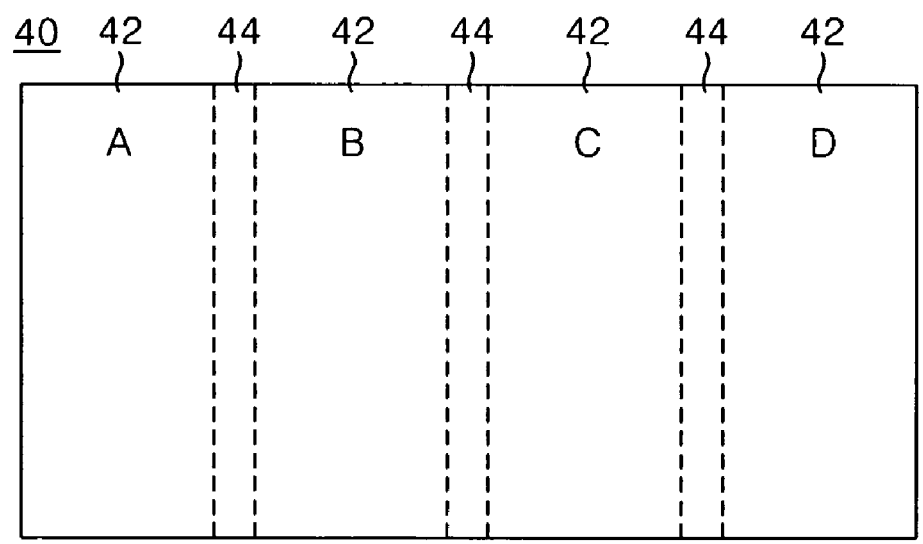

When the mask 30 is employed in a stitch (or divided) exposure method, the mask 30 is sequentially exposed to form shot areas A to D shown in FIG. 3. When the first shot area A is exposed, light is exposed to the overlapping area 44 through the right overlapping part 36 of the mask 30. When the second shot area B is exposed, light is exposed to the overlapping area 44 through the left overlapping part 34 of the mask 30. Accordingly, the patterns formed at the overlapping area 44 have substantially the same CD as the patterns formed at the non-overlapping area 42.

In addition, in the overlapping area 44 of each of the shot areas A to D, the difference in light intensity of the left and right sides of the exposer is compensated by the CD deviation in the left and right overlapping parts 34 and 36 of the mask 30, thereby preventing the CD deviation between the shot areas. Accordingly, the stitch stain in the liquid crystal display panel caused by the CD deviation in the overlapping area 44 of the shot areas A to D can be reduced.

Figure 1:
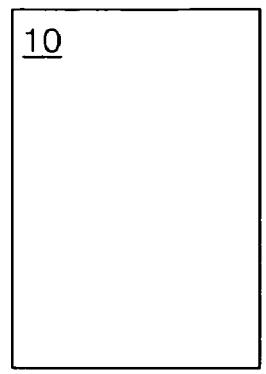
FIG. 1 illustrates a stitch exposure method according to a related art.
Figure 1:
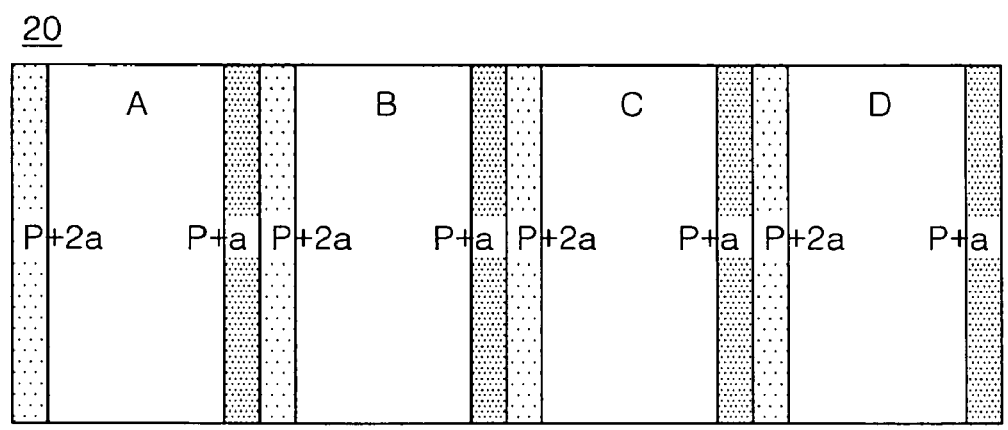
Figure 1:
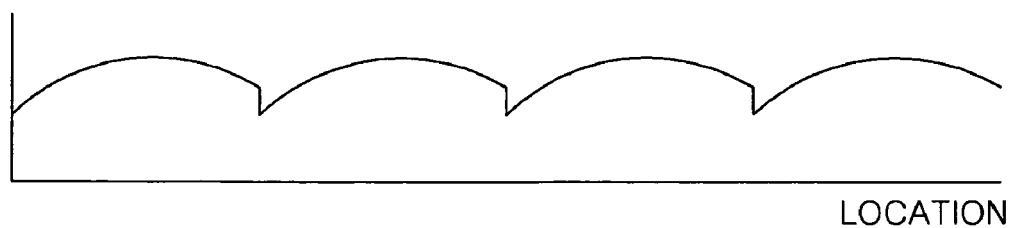
Figure 4:
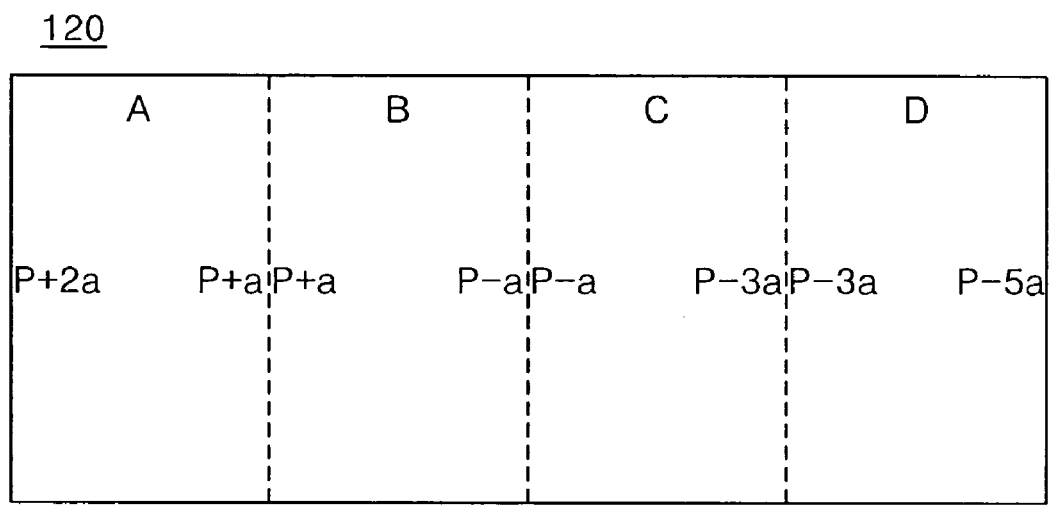
FIG. 4 illustrates a stitch exposure method according to a second embodiment of the present invention.

FIG. 4 illustrates a stitch exposure method according to a second embodiment of the present invention. A substrate 120 has a thin film (a metal layer, an insulating film, a semiconductor layer or the like, not shown) and a photo-resist formed on the thin film for patterning. The photo-resist on the substrate 120 is divided into the four shot areas A to D and exposed by use of an exposure mask, for example, the mask 10 shown in FIG. 1. The light exposure of each shot area, A to D, is separately controlled in order to compensate for the light exposure deviation at the boundary areas of the shot areas A to D.

For example, when the first shot area A is exposed by an exposer having a left and right light exposure deviation of P+2a:P+a, the exposer is then controlled to have the left and right light exposure deviation of P+a:P−a for the second shot area B, as illustrated in FIG. 4. To this end, the exposure speed of the exposer, i.e., light scan speed, or an absolute luminous intensity can be controlled. Accordingly, the deviation between the right light exposure of the first shot area A and the left light exposure of the second shot area B can be reduced. Further, when the third shot area C is exposed, the exposer is controlled in the same method as described above, to have the left and right deviation of P−a:P−3a. Further, when the fourth shot area D is exposed, the exposer is controlled to have the left and right deviation of P−3a:p−5a.

In this way, in the stitch exposure method according to the second embodiment of the present invention, the left light exposure deviation for the next shot area becomes the same as the right light exposure deviation for the previous shot area in the boundary areas of the first to fourth shot areas A to D. Accordingly, the CD deviation caused by the light exposure deviation in the boundary areas of the first to fourth shot areas A to D is reduced, thereby minimizing or preventing the stitch stain in the liquid crystal display panel.

Figure 5:
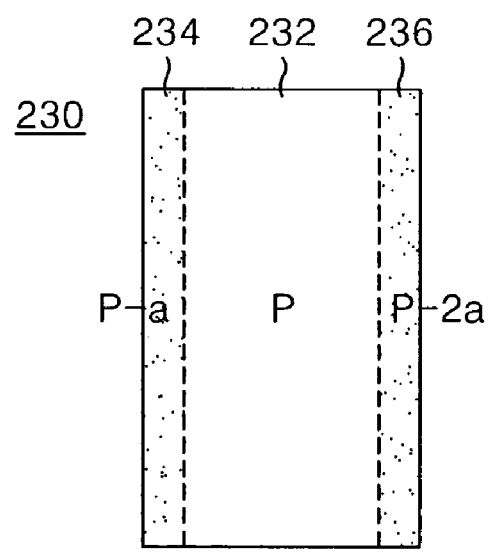
FIG. 5 illustrates a stitch exposure method according to a third embodiment of the present invention.
Figure 5:
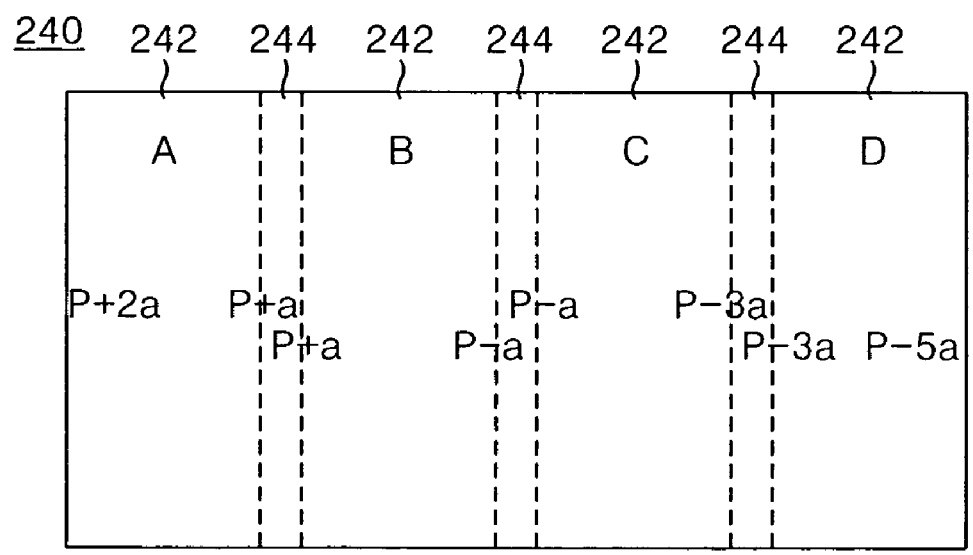

FIG. 5 illustrates a stitch exposure method according to a third embodiment of the present invention. Referring to FIG. 5, a mask 230 includes a non-overlapping part 232 where a pattern is formed to have a predetermined CD, and left and right overlapping parts 234 and 236 where the amount of a pattern decreases in the direction of the horizontal edges of the mask 230 in a similar manner discussed with respect to the first embodiment. The left and right overlapping parts 234 and 236 of the mask 230 correspond to the areas where adjacent shot areas overlap each other.

Each of the shot areas A to D in FIG. 5 is sequentially exposed to light through the mask 230. The overlapping areas 244 of the first to fourth shot areas A to D are exposed to light through the right overlapping part 236, and is also exposed to light through the left overlapping part 234 of the mask 230 in the next shot process. Accordingly, the patterns formed at the overlapping areas 244 have substantially the same CD as the patterns at the non-overlapping area 242.

Further, in the overlapping area 244 of the first to fourth shot areas A to D, the exposer is controlled for each of the shot areas A to D in order that the left light exposure deviation of the next shot becomes the same as the right light exposure deviation of the previous shot. Accordingly, the CD deviation caused by the light exposure deviation in the overlapping part 244 of the first to fourth shot areas A to D is reduced, thereby minimizing the stitch stain in the liquid crystal display panel.

As described above, the patterns formed at the left and right overlapping parts of a mask according to the present invention compensate for the difference in light intensity of the left and right sides of the exposer, which means, the mask is formed to have a CD deviation opposite the difference in light intensity of the exposure, thereby reducing or preventing the stitch stain in the liquid crystal display panel.

Further, according to a stitch exposure method of the present invention, the left light exposure deviation for the next shot area becomes the same as the right light exposure deviation for the previous shot area in the boundary areas between the shot areas by controlling the light intensity distribution of the exposer. Accordingly, the CD deviation caused by the light exposure deviation in the boundary areas between the adjacent shot areas is reduced, thereby reducing or preventing the stitch stain in the liquid crystal display panel.

It will be apparent to those skilled in the art that various modifications and variation can be made in the invention without departing from the spirit or scope of the invention. Thus, it is intended that the invention cover the modifications and variations of this invention provided they come within the scope of the appended claims and their equivalents.

What is claimed is:

1. A divided exposure method for a liquid crystal display using a mask having a non-overlapping part and left and right overlapping parts, wherein patterns at the left and right overlapping parts are different from a pattern of the non-overlapping part, the method comprising:
   providing a substrate having a thin film;
   forming a photoresist layer on the thin film;
   providing the mask over a first shot area of the photoresist layer;
   irradiating light onto the first shot area through the mask by an exposer;
   positioning the mask to a second shot area of the photoresist layer, wherein the second shot area partially overlaps the first shot area such that the left and the right overlapping parts of the mask correspond to a portion of the first shot area; and
   irradiating light onto the second shot area through the mask by the exposer, and
   wherein the patterns at the left and right overlapping parts of the mask are different from each other in order to compensate for left and right exposure light intensity deviation of the exposer, and
   wherein the mask is formed to have a critical dimension deviation opposite a light intensity difference of the exposer such that the patterns formed at the left and right overlapping parts of the mask compensate for the difference in light intensity of the left and right sides of the exposer.

2. A divided exposure method for a liquid crystal display using a mask comprising:
   providing a substrate having a thin film;
   forming a photoresist layer on the thin film, wherein the photoresist layer is divided into at least first and second shot areas;
   irradiating a first light on the first shot area through the mask by an exposer;
   positioning the mask to the second shot area; and
   irradiating a second light on the second shot area through the mask by the exposer,
   wherein the intensity of the second light exposed to a left side of the second shot area is substantially the same as the intensity of the first light exposed to a right side of the first shot area such that a critical dimension deviation caused by light exposure deviation in a boundary area is reduced, thereby minimizing a stitch stain in a liquid crystal display panel.

3. The method according to claim 2, wherein the intensity of the second light is adjusted by controlling a scan speed or a luminous intensity of the exposer.

4. The method according to claim 2, wherein the second shot area partially overlaps the first shot area.

* * * * *